(12) United States Patent
Biber

(10) Patent No.: US 8,547,098 B2
(45) Date of Patent: Oct. 1, 2013

(54) MAGNETIC RESONANCE SYSTEM

(75) Inventor: Stephan Biber, Erlangen/Frauenaurach (DE)

(73) Assignee: Siemens Aktiengesellschaft, München (DE)

(*) Notice: Subject to any disclaimer, the term of this patent is extended or adjusted under 35 U.S.C. 154(b) by 230 days.

(21) Appl. No.: 13/051,239

(22) Filed: Mar. 18, 2011

(65) Prior Publication Data
US 2011/0234229 A1    Sep. 29, 2011

(30) Foreign Application Priority Data

Mar. 23, 2010 (DE) .......................... 10 2010 012 393

(51) Int. Cl.
*G01V 3/00* (2006.01)
(52) U.S. Cl.
USPC ........................................ 324/307; 324/322
(58) Field of Classification Search
USPC ........................... 324/300–322; 600/407–445
See application file for complete search history.

(56) References Cited

U.S. PATENT DOCUMENTS

| 6,750,652 B2 * | 6/2004 | Weyers et al. ............... 324/318 |
| 7,834,626 B2 * | 11/2010 | Renz .......................... 324/318 |
| 2008/0136418 A1 * | 6/2008 | Renz .......................... 324/322 |

FOREIGN PATENT DOCUMENTS

| DE | 101 05 984 C1 | 10/2002 |
| DE | 10 2008 023 467 A1 | 12/2009 |

OTHER PUBLICATIONS

German Office Action dated Nov. 19, 2010 for corresponding German Patent Application No. DE 10 2010 012 393.5-54 with English translation.

* cited by examiner

*Primary Examiner* — Brij Shrivastav
(74) *Attorney, Agent, or Firm* — Lempia Summerfield Katz LLC

(57) ABSTRACT

A magnetic resonance system includes at least one coil and at least one coaxial line connecting the at least one coil to an electronic receive system. The at least one coil includes a preprocessing device that converts the received signals to at least one transmission frequency that is different from a transmit frequency. The coaxial line includes at least one sheath wave barrier with a trap suppressing sheath waves of transmit frequency both on the outside and the inside of a sheath conductor of the coaxial line.

18 Claims, 4 Drawing Sheets

FIG 2

MAGNETIC RESONANCE SYSTEM

This application claims the benefit of DE 10 2010 012 393.5, filed Mar. 23, 2010.

BACKGROUND

The present embodiments relate to a magnetic resonance system.

Coaxial cables that are subject to field fluctuations are used in modern magnetic resonance systems to transport receive signals from local coils. The local coils are used to allow the recording of images with a high signal-to-noise ratio. A local coil or a coil may be an antenna. The coil may include one or more individual coil elements (e.g., loops; an array coil). In addition to the coil elements, the coil may also include a preamplifier, further electronic systems and cabling, a housing and a cable with a plug. The plug may be used to connect the coil to the magnetic resonance system (e.g., to a plug-in station of a patient couch, bed or table).

When recording magnetic resonance images using local coils, excited nuclei induce a voltage in the coil, which is amplified using a low-noise preamplifier (LNA) and forwarded by cable (e.g., at the transmit frequency) to the electronic receive system. To improve the signal-to-noise ratio further, high-field systems may be used. The basic field strengths of the high-field systems may be around 3 Tesla or higher.

When in use, a local coil is located in a transmit field (e.g., B1 field) of a whole body coil. The whole body coil is a large coil that encloses an object to be recorded and is used to excite the spins in the object to be recorded. In this process, the whole body coil generates a circular or elliptical B1 field. This B1 field causes currents to be induced on all the conductors present in the B1 field. Resonance effects may result on longer cables, for example, when the cables act as antennas. In the case of coaxial cables, high currents flow on the outsides of sheath conductors (e.g., shields), which in extreme cases, may become hot and endanger the patient. Before the resulting induced currents are so high that the patient may be at risk, the B1-induced currents may cause secondary B1 fields on the conductor structures of the cables, having an adverse effect on the B1 homogeneity of the transmit field of the whole body coil.

A further problem arises when the coaxial cable experiences a discontinuity (e.g., when the coaxial cable is soldered to a printed circuit board or there is some other departure from coaxial mode). The preamplified receive signals may travel from the inside of the sheath conductor to the outside of the sheath conductor. If the coaxial cable passes close to a coil, the preamplified signal feeds back into the coil, thereby producing self-oscillation of the local coil. In such a state, the local coil may not be used for magnetic resonance imaging.

The currents/waves induced by the transmit field or the receive signals on the sheath conductor of a coaxial cable may be referred to as "sheath waves." The two problems that may result due to sheath waves were explained above: sheath waves generated by the transmit coil are the cause of B1 homogeneity problems and problems with unacceptably high levels of heat for the patient; and sheath waves generated by the receive signal may feed back into the receive coil and produce self-oscillation of the coil.

To resolve these problems, sheath wave barriers may be provided in line structures that are significantly longer than several tens of centimeters. Sheath wave barriers include resonant traps, which are intended to suppress the current flow at transmit frequency. Since in magnetic resonance systems of the current art, the transmit frequency of the whole body coil and the receive frequency of the local coil and the signal transmitted from the local coils on coaxial lines to the system are identical, sheath waves may only be suppressed on the outside of the sheath conductor. The entire coaxial cable may be wound to an inductance. A parallel capacitor connected to the outside of the sheath conductor completes the sheath wave barrier. The barrier effect results for currents on the outside of the sheath conductor of the coaxial cable. Sheath waves are not suppressed on the inside because the useful signal, which is also at transmit frequency, would also be suppressed. Other types of sheath wave barriers are also known (e.g., bazooka baluns, which are geometrically different in structure but are also intended to only suppress the current on the outside of the sheath and allow the current on the inside to flow unhindered at transmit frequency).

The known sheath wave barriers or baluns have a number of problems.

1. Sheath wave barriers may only be wound manually and are therefore expensive.

2. Because of the large diameter of the coaxial cable and the minimal bending radii of the coaxial cable, sheath wave barriers use a relatively large amount of space (e.g., for the coaxial cable wound to an inductance).

3. The space used in local coils is problematic (e.g., for coils that are to be mechanically flexible).

4. Sheath wave barrier models cannot be matched easily, since the inductance is determined by the number of windings of the coaxial cable inductance. The sheath wave barriers are therefore manually produced special components specifically for the magnetic resonance application.

Arrangements for transmitting magnetic resonance signals have been proposed with a transmission path that connects the local coil to a receiver, with a preprocessing device being provided within the local coil to convert the received signals to at least one transmission frequency that is different from the transmit frequency.

For example, it was proposed in DE 10 2008 023 467 A1 that an arrangement be used, in which two intermediate frequencies are used in order to be able to transmit received signals from a number of channels by way of a single coaxial cable. A first channel of the local coil includes a first coil element for receiving a first magnetic resonance signal and a first mixer connected to the first coil element. The first mixer forms a first signal of intermediate frequency from the supplied first magnetic resonance signal. A second channel of the local coil includes a second coil element and a second mixer, the second mixer forming a second signal of intermediate frequency from the supplied second magnetic resonance signal. The local coil includes a signal combining facility, which combines the intermediate-frequency first signal of the first channel and the intermediate-frequency second signal of the second channel by frequency multiplexing, so that the received signals reach the receiver by way of the transmission path. Two local oscillator frequencies may be used for frequency conversion purposes, each local oscillator frequency being supplied to the mixers, the intermediate frequencies formed by frequency conversion having mirror symmetry in relation to a sampling frequency or a multiple of the sampling frequency of the analog/digital converter used.

As an alternative or in addition to such a frequency multiplex transmission, the received signals may be digitized within the local coil.

SUMMARY AND DESCRIPTION

The present embodiments may obviate one or more of the drawbacks or limitations in the related art. For example, a magnetic resonance system with improved suppression of sheath waves with a simpler and more economical sheath wave barrier of smaller structure may be provided.

To achieve this with a magnetic resonance system of the type discussed above, the coaxial line includes at least one sheath wave barrier with a trap suppressing sheath waves of transmit frequency both on the outside and inside of a sheath conductor of the coaxial line.

The present embodiments make advantageous use of the fact that before transmission of the received signals by the coaxial line (e.g., coaxial cable), the frequency of the received signals has been changed to allow the sheath waves occurring on the outside of the sheath conductor to be suppressed and allow the sheath waves occurring on the inside of the sheath conductor to also be suppressed. Currents in the entire sheath conductor are therefore suppressed by a trap that is resonant at the transmit frequency of a transmit coil. The trap is configured to block the transmit frequency but allow the other useful or auxiliary signals being transmitted by the coaxial line to pass unhindered. The suppression of signals of the inner frequency on the inside of the sheath conductor is not problematic, as the useful signals have a frequency that is different from the transmit frequency, the same also applying to any auxiliary signals used.

With the magnetic resonance system of the present embodiment, the sheath conductor may be completely split at the sheath wave barrier for connection to the trap. The sheath conductor is completely split to connect the trap that is resonant at the transmit frequency in an intermediate manner. This allows sheath wave barriers to be produced not by winding coaxial cables or by geometrically large bazookas-type barriers, but by building up a filter network of simple, commercially available coils and capacitors. All these components are commercially available and may be fitted on printed circuit boards in an automated manner. The trap may include a filter network with at least one coil and at least one capacitor and/or the trap may be provided on a printed circuit board.

This results in a sheath wave barrier of much simpler, more economical and geometrically smaller structure for local coils and local coil cabling, with which the received signal has been converted to a different frequency or otherwise further processed (e.g., digitized) before transmission from the local coil to the electronic receive system so that at the transmit frequency, no relevant information is transmitted by the line from the local coil to the electronic receive system or vice versa.

A preprocessing facility (e.g., preprocessing device) may be configured to convert the received signals to at least one intermediate frequency and/or to digitize the received signals. For example, the transmission arrangement described in DE 10 2008 023 467 A1 may be used, but systems with upstream signal processing (e.g., digitization) may also be used.

In one embodiment, a trap may also be connected in an inner conductor of the coaxial line as part of the sheath wave barrier. The trap may be the same as the trap connected in the sheath conductor, for example. Providing the inner conductor with the trap as part of the sheath wave barrier also has the advantage that the discontinuity resulting from the complete splitting of the sheath provides that the signal does not jump in an unintended manner from the inside of the sheath conductor to the inner conductor to be further transmitted there. Such an effect is avoided by also using a trap for the likewise completely split inner conductor.

In addition to the magnetic resonance system, the present embodiments also relate to a coaxial line for a magnetic resonance system for connecting a local coil to an electronic receive system. The local coil includes a preprocessing device that converts the received signals to at least one transmission frequency that is different from the transmit frequency. The coaxial line includes at least one sheath wave barrier with a trap suppressing sheath waves of transmit frequency both on the outside and inside of a sheath conductor of the coaxial line. With the coaxial line, the sheath wave barrier is used, which also blocks signals of transmit frequency from a whole body coil or another transmit coil of the magnetic resonance system on the inside of the sheath conductor. All the embodiments and configurations described with respect to the magnetic resonance system may be applied, along with the advantages, in a similar manner to the coaxial line of the present embodiments.

With both the magnetic resonance system and the coaxial line of the present embodiments, a number of sheath wave barriers may be provided along a coaxial cable.

BRIEF DESCRIPTION OF THE DRAWINGS

FIG. 2 shows a signal path from a coil to an electronic receive system in a first embodiment;

DETAILED DESCRIPTION OF THE DRAWINGS

Figure 1:
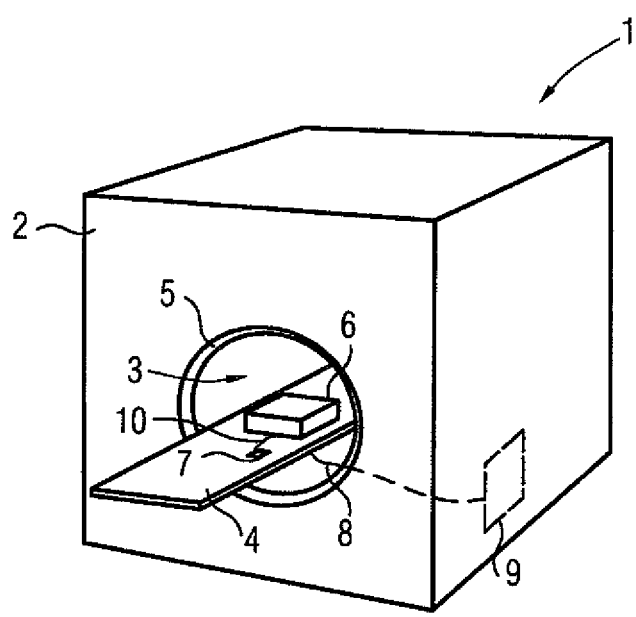
FIG. 1 shows a diagram of one embodiment of a magnetic resonance system.

FIG. 1 shows a diagram of one embodiment of a magnetic resonance system 1. The magnetic resonance system 1 includes a basic magnet 2 that includes a patient receiving unit 3, in which a patient couch 4 (e.g., a patient bed) may be suspended by hooks.

A whole body coil 5 is also provided in the patient receiving unit 3. The whole body coil 5 emits magnetic resonance signals at a transmit frequency to excite nuclei within an object to be recorded (e.g., a patient).

A local coil 6 connected to a plug-in station 7 is disposed on the patient couch 4. The local coil 6 receives magnetic resonance signals (e.g., received signals) in response to the excitation brought about by the whole body coil 5. The received signals may be forwarded to an electronic receive system 9 by way of a transmission path, at least part of which may include a coaxial line 8.

A coaxial cable 10 may also be provided to connect the local coil 6 to the plug-in station.

Figure 2:
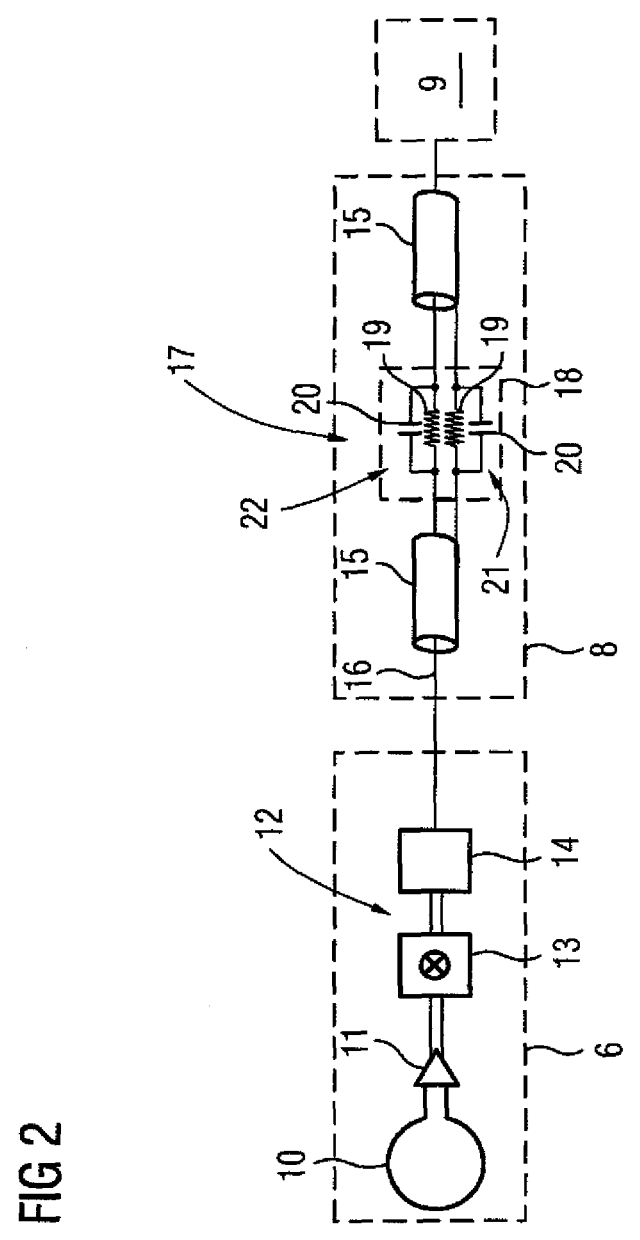

Details of one embodiment of the local coil 6 and the coaxial line are illustrated with the diagram of the transmission path in FIG. 2.

The local coil 6 includes at least one coil element 10 (e.g., loop), which receives the magnetic resonance signal. The received signal is amplified by a preamplifier 11 and forwarded to a preprocessing device 12. The preprocessing device 12 includes a frequency converter 13 and a processing unit 14. In the frequency converter 13, the received signal is converted to a different frequency subject to synchronization by a system clock pulse or a local oscillator. Digitization or other preparation of the received signal may, for example, also take place in the processing unit 14.

The received signal leaves the local coil 6 at a different frequency from a transmit frequency and enters the coaxial line 8. Only a sheath conductor 15 and an inner conductor 16 of the coaxial line 8 are shown in FIG. 2 for the sake of simplicity.

A sheath wave barrier 17 is provided over the course of the coaxial line 8. The sheath conductor 15 is split at the sheath wave barrier 17, and two ends of the sheath conductor 15 are, for example, connected by a commercially available coil 19 disposed on a printed circuit board 18. A capacitor 20 is connected to the printed circuit board 18 in a parallel manner to form a trap 21. A resonant circuit including the coil 19 and the capacitor 20 is formed. The resonant circuit has a resonant frequency that corresponds to the transmit frequency so that sheath waves of the transmit frequency are suppressed on both the inside and the outside of the sheath conductor 15.

So that the sheath wave does not jump over onto the inner conductor 16, the inner conductor is also split and connected by way of a trap 22 (e.g., of the same type or a different type as the trap 21) to a commercially available coil 19 and a commercially available capacitor 20, for example. The two traps 21, 22 may be provided on the printed circuit board 18.

Any other filters may be used as traps 21, 22 instead of the illustrated parallel resonant circuit. Higher order filters with a barrier region at transmit frequency are, for example, possible. Signals at useful frequencies are not blocked.

Figure 3:
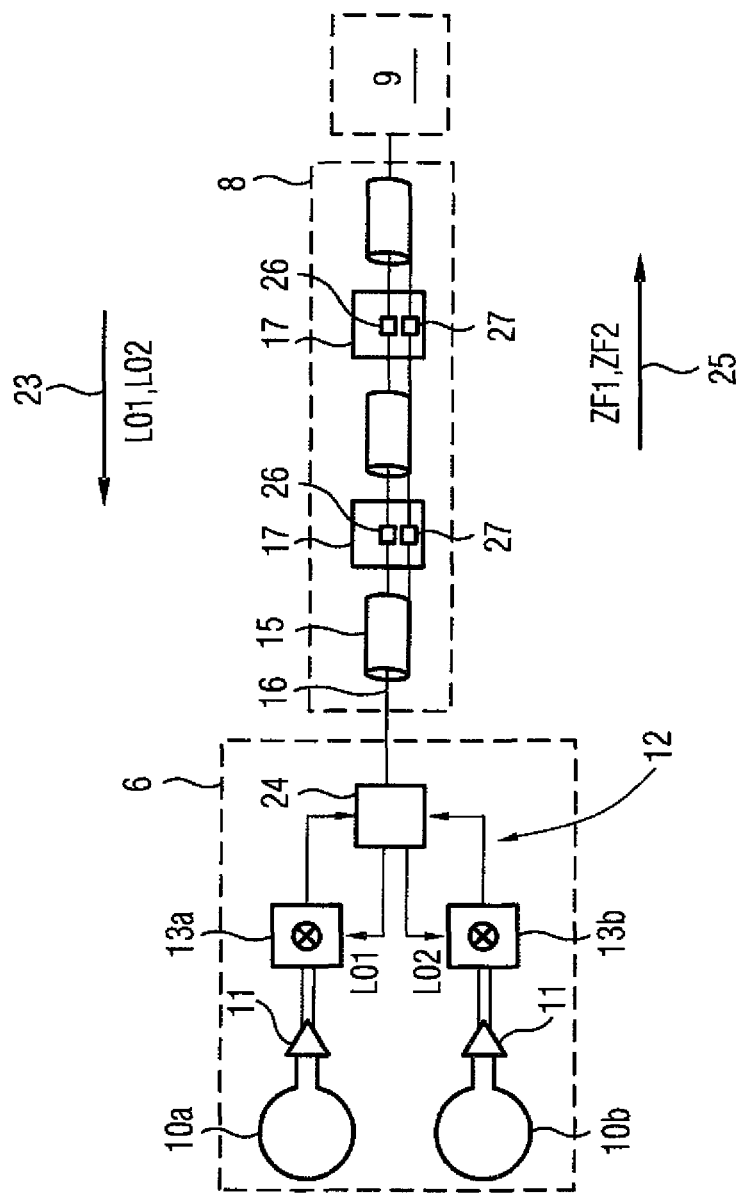
FIG. 3 shows the signal path from a coil to an electronic receive system in a second embodiment.

FIG. 3 shows the signal path in another embodiment of the local coil and the coaxial line. The local coil 6 includes at least two coil elements, (e.g., a first coil element 10A and a second coil element 10B). A first received signal and a second received signal are each amplified by preamplifiers 11 and are forwarded to frequency converters 13A and 13B (e.g., a first mixer and a second mixer), respectively. The first mixer and the second mixer are synchronized by way of auxiliary frequency signals LO1, LO2, which are transmitted by the coaxial line 8 (e.g., see arrow 23). The first received signal is converted to a first intermediate frequency ZF1, and the second received signal is converted to a second intermediate frequency ZF2. In a device 24 for signal combining, the first received signal and the second received signal are combined such that the first received signal and the second received signal may be transmitted together by the coaxial line 8 (e.g., see arrow 25).

Two sheath wave barriers 17 are provided in the coaxial line 8. The inner conductor 16 and the sheath conductor 15 are completely split in each of the two sheath wave barriers 17 to be connected by way of a filter network 26, 27 in the manner of a trap 21, 22.

Figure 4:
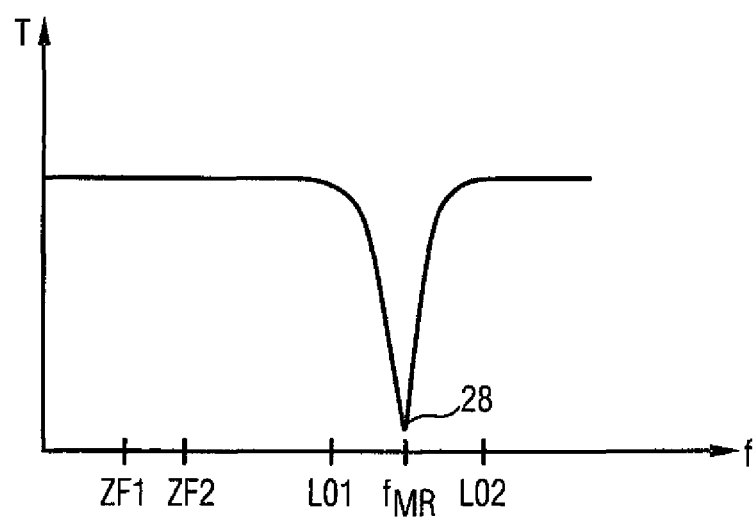
FIG. 4 shows example transmission of a trap of a sheath wave barrier.

FIG. 4 shows the transmission behavior T of the filter networks 26, 27 against frequency. A transmission minimum 28 is at transmit frequency $f_{MR}$. For the local oscillator frequencies LO1 and LO2 and for the intermediate frequencies ZF1, ZF2, there is good transmission so that transmission is not restricted despite the barrier on the inner conductor, inside of the sheath conductor and outside of the sheath conductor.

As mentioned above, the sheath wave barrier 17 may be produced using conventional components (e.g., capacitors and coils), for example, by fitting a printed circuit board in the known manner.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A magnetic resonance system comprising:
    a coil comprising a preprocessing device that converts received signals to a transmission frequency that is different from a transmit frequency; and
    a coaxial line connecting the coil to an electronic receive system,
    wherein the coaxial line comprises a sheath wave barrier with a trap suppressing sheath waves of the transmit frequency on an outside and an inside of a sheath conductor of the coaxial line.

2. The magnetic resonance system as claimed in claim 1, wherein the preprocessing device is configured to convert the received signals to an intermediate frequency, digitize the received signals, or convert the received signals to the intermediate frequency and digitize the received signals.

3. The magnetic resonance system as claimed in claim 1, wherein the sheath conductor is split at the sheath wave barrier for connection to the trap.

4. The magnetic resonance system as claimed in claim 1, wherein the trap is connected as part of the sheath wave barrier in an inner conductor of the coaxial line.

5. The magnetic resonance system as claimed in claim 1, wherein the coil is a first coil, and
    wherein the trap comprises a filter network with a second coil and a capacitor or the trap is provided on a printed circuit board.

6. A coaxial line for a magnetic resonance system for connecting a local coil to an electronic receive system, the local coil comprising a preprocessing device that converts received signals to a transmission frequency that is different from a transmit frequency, the coaxial line comprising:
    a sheath wave barrier with a trap suppressing sheath waves of the transmit frequency on an outside and an inside of a sheath conductor of the coaxial line.

7. The coaxial line as claimed in claim 6, wherein the sheath conductor is split at the sheath wave barrier for connection to the trap.

8. The coaxial line as claimed in claim 6, wherein the trap is connected as part of the sheath wave barrier in an inner conductor of the coaxial line.

9. The coaxial line as claimed in claim 6, wherein the coil is a first coil, and
    wherein the trap comprises a filter network with a second coil and a capacitor, the trap is provided on a printed circuit board, or the trap comprises the filter network with the second coil and the capacitor and the trap is provided on the printed circuit board.

10. The magnetic resonance system as claimed in claim 2, wherein the sheath conductor is split at the sheath wave barrier for connection to the trap.

11. The magnetic resonance system as claimed in claim 2, wherein the trap is connected as part of the sheath wave barrier in an inner conductor of the coaxial line.

12. The magnetic resonance system as claimed in claim 3, wherein the trap is connected as part of the sheath wave barrier in an inner conductor of the coaxial line.

13. The magnetic resonance system as claimed in claim 2, wherein the coil is a first coil, and
    wherein the trap comprises a filter network with a second coil and a capacitor or the trap is provided on a printed circuit board.

14. The magnetic resonance system as claimed in claim 3, wherein the coil is a first coil, and
    wherein the trap comprises a filter network with a second coil and a capacitor or the trap is provided on a printed circuit board.

15. The magnetic resonance system as claimed in claim 4, wherein the coil is a first coil, and
    wherein the trap comprises a filter network with a second coil and a capacitor or the trap is provided on a printed circuit board.

16. The coaxial line as claimed in claim 7, wherein the trap is connected as part of the sheath wave barrier in an inner conductor of the coaxial line.

17. The coaxial line as claimed in claim 7, wherein the coil is a first coil, and wherein the trap comprises a filter network with a second coil and a capacitor, the trap is provided on a printed circuit board, or the trap comprises the filter network with the second coil and the capacitor and the trap is provided on the printed circuit board.

18. The coaxial line as claimed in claim 8, wherein the coil is a first coil, and wherein the trap comprises a filter network with a second coil and a capacitor, the trap is provided on a printed circuit board, or the trap comprises the filter network with the second coil and the capacitor and the trap is provided on the printed circuit board.

\* \* \* \* \*